United States Patent [19]

Hiraki et al.

[11] 4,431,562
[45] Feb. 14, 1984

[54] HYDROGEN-CONTAINING SILICIC SUBSTANCE, PROCESS FOR PRODUCING THE SAME AND USE THEREOF

[75] Inventors: Akio Hiraki, Hyogo; Takeshi Imura; Wako Kanmura, both of Osaka, all of Japan

[73] Assignee: Meidensha Electric Mfg., Co., Ltd., Tokyo, Japan

[21] Appl. No.: 377,530

[22] Filed: May 12, 1982

[30] Foreign Application Priority Data

May 12, 1981 [JP] Japan ................................. 56-70200

[51] Int. Cl.$^3$ ............................. B01J 8/00; C01B 3/02
[52] U.S. Cl. ............................. 252/188.25; 252/181.5; 252/181.6; 252/184; 252/188.31; 423/248; 423/347; 423/648 R
[58] Field of Search .................... 252/188.25, 188.3 R, 252/184, 181.5, 181.6; 423/248, 347, 644, 645, 648 R

[56] References Cited

U.S. PATENT DOCUMENTS 4,265,720  5/1981  Winstel ............................... 204/129

OTHER PUBLICATIONS

Pankove, Applied Physics Letters, 32(12), 15 Jun. 1978, pp. 812–813.
Pankove & Carlson, Applied Physics Letters, vol. 31, No. 7, 1 Oct. 1977, pp. 450–451.
Pankove, Lampert and Tarng, Applied Physics Letters, vol. 32, No. 7, 1 Apr. 1978, pp. 439–441.

*Primary Examiner*—Irwin Gluck
*Attorney, Agent, or Firm*—Sughrue, Mion, Zinn, Macpeak, and Seas

[57] ABSTRACT

A hydrogen-containing silicic substance comprising a four-coordinate Si lattice surrounded by a shell of $SiH_2$ and/or $SiH_3$ is disclosed. The substance contains unbound hydrogen in the Si lattice, making it possible to conveniently store hydrogen.

9 Claims, 5 Drawing Figures

HYDROGEN-CONTAINING SILICIC SUBSTANCE, PROCESS FOR PRODUCING THE SAME AND USE THEREOF

FIELD OF THE INVENTION

The present invention relates to a novel hydrogen-containing silicic substance, a process for producing the same, and use thereof. More particularly, the invention relates to a silicic substance containing a large amount of unbound hydrogen, a special process for producing the substance, and using the substance as a hydrogen storing fuel.

BACKGROUND OF THE INVENTION

There is essentially no limit to the sources from which hydrogen can be obtained. Furthermore, it produces no harmful waste materials when burnt, and is fairly easy to transport and store. Because of these advantages, hydrogen is now considered as one of the new energy substitutes for fossil fuels such as petroleum and coal. Accordingly, there is a great demand for the development of safe and economical technology for industrial transportation and storage of hydrogen. Such technology must of course be adapted to the future use of hydrogen in large quantities and for various purposes.

The most promising methods that have been proposed for transporting and storing hydrogen on an industrial scale is to solidify hydrogen in the form of a metal hydride. According to one experimental method, hydrogen produced by electrolysis of water with excess electric power is stored in the form of a solid metal hydride until it is recovered for use as a source of energy. Rare earth transition metals (e.g. $LaNi_5$) and Ti-Fe have been proposed as substances to be chemically combined with hydrogen.

However, these metallic compounds have the following defects: (1) their hydrides break into fine particles as a result of repeated cycles of storing and releasing hydrogen; (2) they comprise expensive metals or alloys whose supply is rather limited; (3) these metallic compounds are heavy and not easy to transport and handle; and (4) the hydride must be stored at two or more atmospheres to prevent evaporation of the hydrogen.

SUMMARY OF THE INVENTION

As a result of various studies on hydrogen compounds that are free from the above described defects, the present inventors have found that a four-coordinate network structure of silicon atoms having a shell of atomic groups $SiH_2$ and $SiH_3$ containing hydrogen covalently bonded to silicon is capable of containing a large quantity of hydrogen in voids in its crystal. Furthermore, they have found that the hydrogen is easily released by heating and that the hydrogen-containing silicic substance is more advantageous than the conventional hydrogen-storing substances.

Therefore, one object of the present invention is to provide a hydrogen-containing silicic substance that contains an easily recoverable form of hydrogen and which is stable and easy to handle at atmospheric temperatures and pressures. Another object is to provide such hydrogen-containing silicic substance in a form usable as a hydrogen-storing material.

DETAILED DESCRIPTION OF THE INVENTION

The present invention provides a hydrogen-containing silicic substance having an average particle size of 100 to 1,000 Å and containing hydrogen in a four-coordinate Si lattice surrounded by a shell of $SiH_2$ and/or $SiH_3$.

Figure 2:
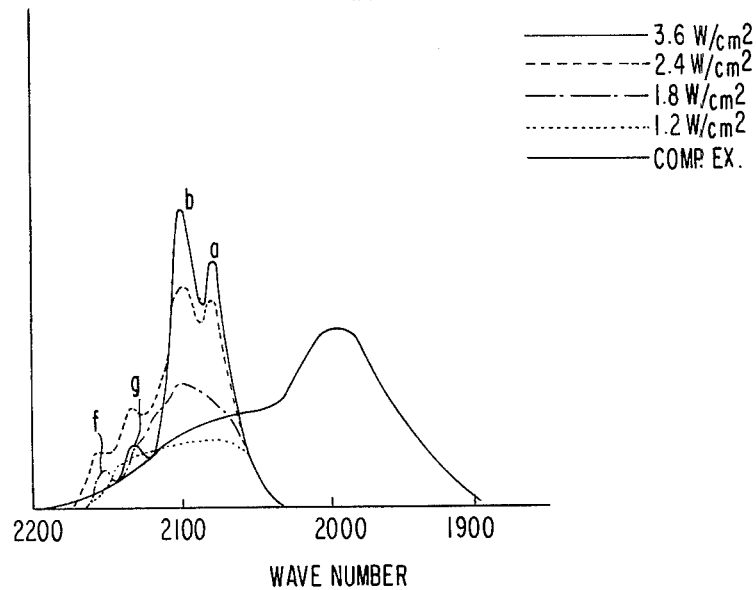
FIGS. 2 and 4 are IR spectral charts for the substances produced in Examples 1 and 2 of the present invention, respectively.

The hydrogen-containing silicic substance of the present invention is novel and its exact chemical structure has not yet been determined. However, it is known that atomic hydrogen which is not chemically combined with silicon atoms is confined in voids in a four-coordinate Si lattice network structure. The structure is formed by covalently bonded silicon atoms within a shell of $SiH_2$ and/or $SiH_3$. Although details of the manner in which the hydrogen atom is confined in voids in the Si lattice network structure are not clear, the novel silicic substance of the present invention contains 50 atomic percent or more of hydrogen in comprison with a known compound wherein hydrogen atoms are chemically combined with silicon atoms as in an amorphous Si-H alloy used in solar cells that has a maximum of 20 atomic percent hydrogen. This fact suggests that the silicic substance of the present invention has a chemical structure different from that of a known silicon hydride, as supported by the IR spectral chart of FIG. 2 shown for the novel silicic substance of the present invention.

The silicon atom chain that makes up the backbone of the novel silicic substance of the present invention may be crystalline or noncrystalline, but it must be free from a Si-H bond.

The novel silicic substance of the present invention can be prepared by subjecting silicon target to vacuum-deposition procedures, such as reactive sputtering, glow discharge, ion implantation and thermal decomposition, under a hydrogen atmosphere at not more than a water cooling temperature, that is 100° C. or less. In a most preferred embodiment, a silicon surface (i.e. target) in a hydrogen atomosphere is subjected to reactive sputtering. The total pressure in the system is preferably from $10^{-2}$ to $10^0$ Torr, and the sputtering atmosphere contains preferably 15 to 100 mol percent hydrogen, more preferably 30 to 100 mol percent hydrogen, and most preferably 100 mol percent hydrogen. A sputtering aid such as He, Ne, Ar, Kr or Xe may be present in an amount of up to about 5%. If sputtering is effected using a gaseous mixture, for example, of hydrogen and argon, a silicic substance having the Ar atom incorporated therein is produced. However, the gaseous component other than hydrogen, the Ar atom, has no substantial effect on the nature of the silicic substance. There is no limitation on the purity of silicon used as the target surface of the bulk source and the purity of silicon used is preferably 90% or more, more preferably 8% or more. Power consumption by sputtering is very low and the use of power of about 100 watts is sufficient for achieving the desired sputtering in a pure hydrogen atomsphere. During sputtering, the silicon atoms emitted from the surface of the bulk source are deposited on the surface of the opposite substrate to form a uniform film while they take up hydrogen atoms in the atmosphere. The film of the novel silicic substance according to the present invention grows generally at the same rate of about 100 Å/min whether the sputtering is effected in a pure hydrogen atomsphere or in the presence of a sputtering aid such as Ar. The substrate is made of glass, metals, synthetic resins and other materials having a nonflammable or flammable smooth surface. The silicic substance of the present invention can be produced continuously by moving it on an endless belt depending on the growth rate of the deposited film. More specifically, an endless belt on which the novel silicic substance film has been vacuum-deposited in an enclosed reaction vessel is continuously supplied into a skimmer outside of the vessel, where the silicic substance film is skimmed from the belt and immediately put aside as a hydrogen-storing material. The belt with bare surface re-enters the reaction vessel where a new silicic substance film is vacuum-deposited on the belt. The reaction vessel is so designed that it is continuously supplied with hydrogen to keep the partial hydrogen pressure in the vessel constant. By this procedure, continuous production of the desired silicic substance can be achieved until the surface of the bulk silicon source is exhausted.

The so produced novel silicic substance contains a very large amount of hydrogen atoms not chemically bound with silicon atoms. Surprisingly enough, these hydrogen atoms can be released from the substance by simply heating it to between 100° and 150° C. This is quite unexpected since conventional silicon hydrides that contain silicon-bound hydrogen in the form of, say, SiH, must be heated to as high as 380° C. to release the hydrogen.

The present inventors have found that because of this characteristic, the novel silicic substance can be used as a hydrogen-storing material. The novel silicic substance deposited on the substrate in the manner described above is collected as a powder by a suitable skimmer, and the powder is packed in a bag for use as a hydrogen-storing material. If the substrate is made of a flammable sheet such as a synthetic resin sheet, the hydrogen-storing material can be directly stored in a sheet form or after being cut to a suitable size. If the substrate is made of a flammable film such as a synthetic resin film, the hydrogen-storing material may be stored in a roll. If the material is used as a fuel, it can be directly fed to a combustion furnace. It should be mentioned that if the novel silicic substance of the present invention is used as a hydrogen-storing material, it may contain a small amount of silicon-bound hydrogen without impairing its value as a source of hydrogen.

The hydrogen-storing material according to the present invention is very stable under atmospheric temperature and pressure conditions. Furthermore, it is very easy to handle and can be stored in a very simple container for an extended time period without deterioration of its quality. Since the material is low density, light weight material transportation costs are reduced to about a third of that of the conventional solid metal hydrides. Another advantage of the material is that it can be produced from abundant silicon sources using low-grade starting materials.

Figure 1:
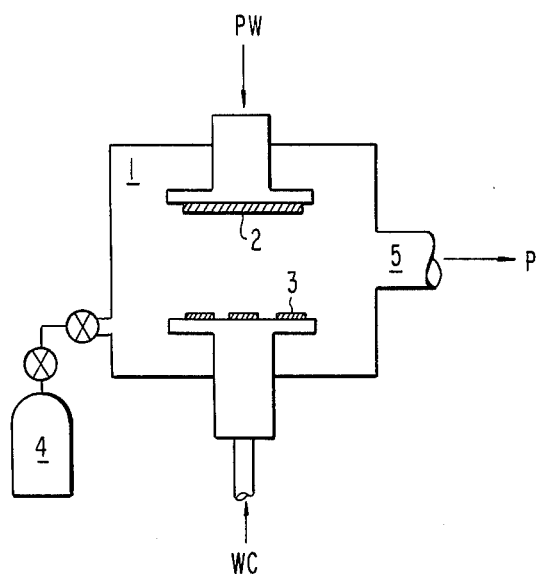
FIG. 1 is a sketch of an apparatus for producing the hydrogen-containing silicic substance of the present invention.

The novel hydrogen-containing silicic substance of the present invention can be produced by a sputtering system of the type shown in FIG. 1. The system comprises a sputtering chamber (1) which includes a silicon target (2) positioned above and opposite a silicon plate or "Nesa" glass plate (3). Power (PW) is applied to establish an electric discharge between the target and substrate to deposit a film of the novel silicic substance on the substrate. The chamber (1) is fed with hydrogen gas from a pressure container (4) while it is evacuated through an exit (5) by a pump (P) to maintain the interior of the chamber at a desired hydrogen concentration and pressure. The substrate is held at a desired temperature with cooling water (WC).

As described in the foregoing, the present invention generally relates to a novel hydrogen-containing silicic substance. However, silicon may be replaced by elements having similar physicochemical properties such as germanium and carbon. The germanium lattice can contain up to 70 atomic percent of nonbound hydrogen, and carbon atoms forming a diamond crystal lattice can contain up to 60 atomic percent of unbound hydrogen.

The present invention is now described in greater detail by reference to the following non-limiting examples.

EXAMPLE 1

A silicon target (80 mmφ) in a high-frequency sputterer (Model NEVA FP-21 of Nippon Electric Varian Co., Ltd.) was subjected to sputtering at a pressure of $5 \times 10^{-1}$ Torr in a hydrogen atomsphere (purity: 99.999%) for a period of about 4 hours using discharge powers of 1.2, 1.8, 2.4 and 3.6 watts/cm$^2$ while the substrate (3) was held at 40° C. under water cooling. Films of silicic substance having an area of 50 cm$^2$ were formed in thicknesses between 1.2 and 1.8 μm. The films grew at a rate of about 80 Å/min and looked substantially alike the known amorphous silicon.

FIG. 2 shows an IR spectral chart for the four respective discharge powers used to produce the films. As can be seen from FIG. 2, the films produced according to the present invention had narrower IR spectral bands than a comparative film of amorphous silicon that was prepared as above except that the sputtering atmosphere consisted of a mixture of argon and 10% hydrogen (the IR spectrum of this comparative film is also shown in FIG. 2).

Figure 3:
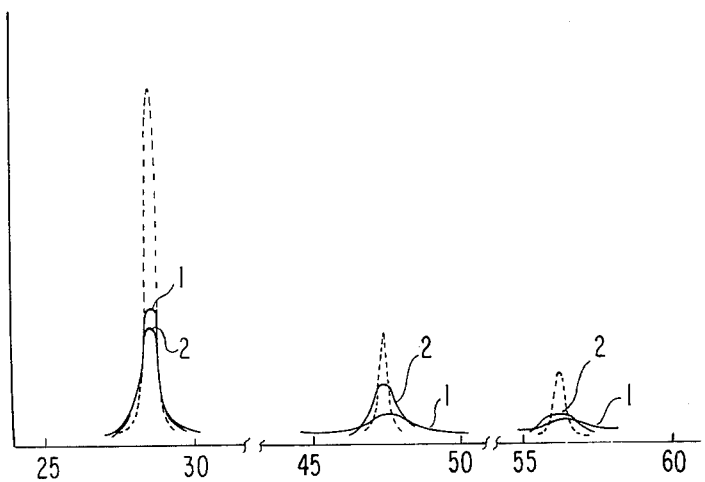
FIG. 3 is an X-ray diffraction pattern charts for the products of Examples 1 and 2.

According to FIG. 2, the IR spectral curve for the novel silicic substance prepared in Example 1 had no peak (2000 cm$^{-1}$) for a ≡Si—H single bond which was observed in an amorphous Si—H system (comparative example), and had the following peak wave numbers at a discharging power of 3.6 watts/cm$^2$: a=2085 cm$^{-1}$, b=2100 cm$^{-1}$, c=2115 cm$^{-1}$, f=2155 cm$^{-1}$ and g=2135 cm$^{-1}$ (a, b and c each indicate =SiH$_2$ bond, and f and g indicate —SiH$_3$ bond). This data shows that the novel silicic substance of the present invention contains only —SiH$_2$ and —SiH$_3$ bonds the positions of whose peaks do not vary with the substrate temperature or discharging power. According to the IR spectral analysis, the novel substance contains about 5 atomic percent hydrogen. However, an elemental analysis shows that the substance contains about 75 atomic percent hydrogen. This clearly indicates the presence of as much as about 70 atomic percent of unbound hydrogen that does not appear in the IR spectrum. X-ray diffraction curve 1 in FIG. 3 shows that the novel silic substance of Example 1 is less crystalline than the known crystalline silicon (indicated by the broken line) and has noncrystalline silicon.

The novel silicic substance of the present invention, such as the substance of Example 1, does not have Ar atoms in voids in the cyrstal. Furthermore, thd network structure of silicon atoms remains intact, so it is assumed that unbound hydrogen atoms are confined in voids in the four-coordinate crystal lattice of silicon atoms. The hydrogen atom has a diameter of about 0.74 Å and this size is small enough to enter voids in the silicon crystal without deforming the nearby area. Therefore, it is possible that unbound hydrogen atoms are deposited simultaneously with silicon atoms being sputtered and come to be confined in voids in the resulting silicon crystal. The novel silicic substances of Example 1 had electrical conductivities and photoconductivities between $10^{-9}$ and $10^{-6} \Omega^{-1} cm^{-1}$.

EXAMPLE 2

Figure 4:
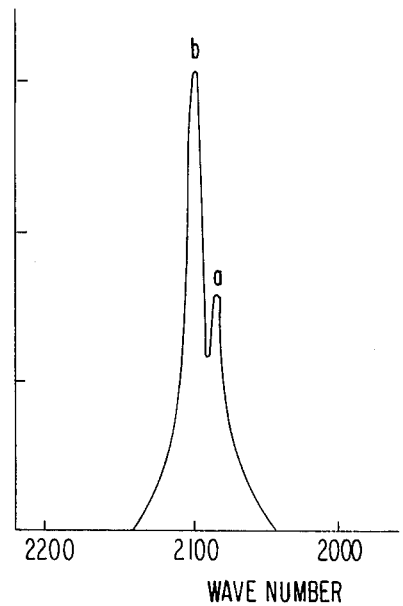

Example 1 was repeated except that He was used as a sputtering aid and that the sputtering atmosphere had a hydrogen concentration of 50 mol%. The film growth rate was about 60 Å/min. The IR spectral chart for the film product is shown in FIG. 4, from which one can see that the product of Example 2 also does not have a peak (2000 cm$^{-1}$) for ≡Si—H, having only =SiH$_2$ peaks a (2085 cm$^{-1}$) and b (2100 cm$^{-1}$). The unbound hydrogen content was 45 atomic percent. An X-ray diffraction pattern of the product is shown in FIG. 3 as curve 2.

EXAMPLE 3

Figure 5:
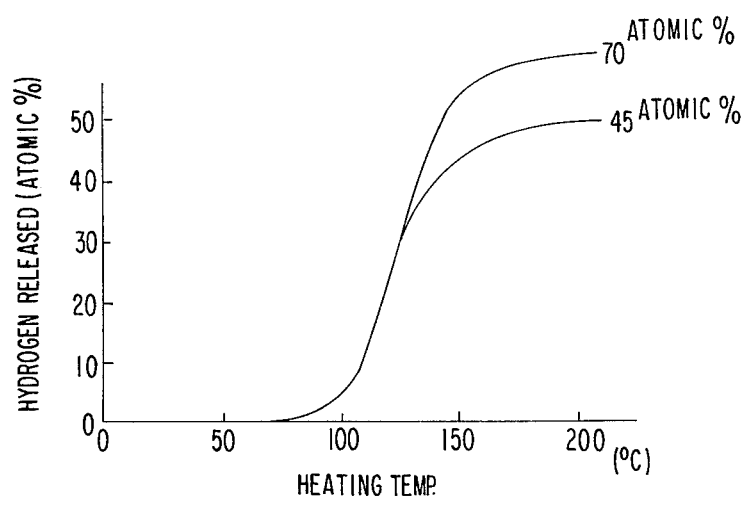
FIG. 5 is a graph showing the relation between the temperature at which the products of Examples 1 and 2 is heated and the amount of hydrogen released.

The hydrogen-containing silicic substances prepared in Examples 1 and 2 were collected as a powder and heated to released hydrogen. The relation between the amount of hydrogen released and the heating temperature is shown in FIG. 5 from which one can see that the release of unbound hydrogen starts at about 70° C., with a sudden increase occurring at 110° C. Almost all of the unbound hydrogen is released at 150° C. The novel hydrogen-containing silicic substances of the present invention are very stable under atmospheric temperature and pressure conditions and present no explosion hazard. They permit the recovery of substantially all the hydrogen by heating at relatively low temperatures. The handling advantages of the hydrogen-containing silicic substance in a powder form (hydrogen content of about 50 atomic %) over hydrogen stored in a pressure container are listed in the following table. The data for the silicic compound of the present invention is based on 20 kg of a packed powder (ca. 200 mesh).

|  | Silicic substance of the present invention | Hydrogen in pressure container |
|---|---|---|
| Storage pressure (atm.) | 1 | 150 |
| Storage volume (liter) | 18* | 39 |
| Stored H$_2$ (kg) | 0.6 | 0.6 |
| Container weight (kg) | 0.2** | 51 |
| Net wt. of silicic substance (kg) | 17.2 | — |
| Total wt. (kg) | 18 | 51.6 |

*bulk density: ca. 1 g/cm$^3$
**Used container is a bag made of polyvinylchloride As shown in the table, the hydrogen-containing silicic substance of the present invention is safer than the conventional hydrogen in a pressure container since it can be handled at atmospheric pressure. Moreover, it occupies less than half the volume of the hydrogen in a pressure container for storing the same amount of hydrogen. Its total weight is about a third of that of the latter. These features make the silicic substance of the present invention very easy to transport and store.

While the invention has been described in detail and with reference to specific embodiments thereof, it will be apparent to one skilled in the art that various changes and modifications can be made therein without departing from the spirit and scope thereof.

What is claimed is:

1. A hydrogen-containing silicic substance, comprising:
   a four-coordinate crystalline Si lattice surrounded by a shell comprised of at least one compound selected from the group consisting of SiH$_2$ and SiH$_3$; and
   hydrogen physically bound in the lattice.

2. A hydrogen-containing silicic substance produced by the process steps comprising subjecting the surface of silicon target to vacuum-deposition procedures in a hydrogen atmosphere at 100° C. or less at 10$^{-2}$ to 10° Torr to deposit a hydrogen-containing silicic substance on a substrate and collecting the silicic substance.

3. A hydrogen-containing silicic substance produced by the process steps of:
   providing a silicon target having a surface;
   providing an atmosphere of hydrogen at 10$^{-2}$ to 1 Torr around the target surface;
   subjecting the target surface to reactive sputtering and depositing a hydrogen-containing substance on a substrate positioned opposite the target in order to form hydrogen-containing silicic substance on the substrate; and
   collecting the silicic substance.

4. A hydrogen-storing material, comprising:
   a support;
   a hydrogen-containing silicic substance in a powder form containing hydrogen in a four-coordinate crystalline Si lattice surrounded by a shell comprised of at least one compound selected from the group consisting of SiH$_2$ and SiH$_3$.

5. The hydrogen-storing material as claimed in claim 4, wherein the support is flammable.

6. The hydrogen-storing material as claimed in claim 4, wherein the support is not flammable.

7. A process for producing a hydrogen-containing silicic substance comprising subjecting the surface of a silicon target to vacuum-deposition procedures in a hydrogen atmosphere at 100° C. or less at 10$^{-2}$ to 10° Torr to deposit a hydrogen-containing silicic substance on a substrate and collecting the silicic substance.

8. The hydrogen-containing silicic substance of claim 1, wherein the substance is a powder.

9. The hydrogen-containing silicic substance of claim 1, wherein the substance is a powder having an average particle size of 100 to 1,000 Å.

* * * * *